(12) United States Patent
Simony et al.

(10) Patent No.: US 7,982,652 B2
(45) Date of Patent: Jul. 19, 2011

(54) ANALOG-TO-DIGITAL CONVERTER

(75) Inventors: Laurent Simony, Gronoble (FR); Lionel Vogt, Saint Martin D'heres (FR)

(73) Assignee: STMicroelectronics SA, Montrouge (FR)

( * ) Notice: Subject to any disclaimer, the term of this patent is extended or adjusted under 35 U.S.C. 154(b) by 70 days.

(21) Appl. No.: 12/543,071

(22) Filed: Aug. 18, 2009

(65) Prior Publication Data
US 2010/0039306 A1 Feb. 18, 2010

(30) Foreign Application Priority Data
Aug. 18, 2008 (FR) ...................................... 08 55608

(51) Int. Cl.
*H03M 1/12* (2006.01)
(52) U.S. Cl. ........................................ 341/156; 375/350
(58) Field of Classification Search .......... 341/122–170; 375/341–350
See application file for complete search history.

(56) References Cited

U.S. PATENT DOCUMENTS
6,608,582 B2 * 8/2003 Casper et al. ................. 341/155
6,904,110 B2 * 6/2005 Trans et al. ................... 375/350

FOREIGN PATENT DOCUMENTS
JP 59143420 A 8/1984

OTHER PUBLICATIONS
M.F. Snoeij et al., A Low-Power Column-Parallel 12-bit ADC for CMOS Imagers, Delft University of Technology, Jun. 2005, pp. 169-172, The Netherlands.

\* cited by examiner

*Primary Examiner* — Lam T Mai
(74) *Attorney, Agent, or Firm* — Lisa K. Jorgenson; E. Russell Tarleton; Seed IP Law Group PLLC

(57) ABSTRACT

A method of analog-to-digital conversion over n bits of an analog signal, including the steps of: comparing the amplitude of the analog signal with a threshold representing the amplitude of the full-scale analog signal divided by $2^k$, where k is an integer smaller than n; performing an analog-to-digital conversion of the analog signal over n–k bits to obtain the n–k most significant bits of a binary word over n bits if the result of the comparison step indicates that the amplitude of the input signal is greater than the threshold, and the n–k least significant bits of this binary word otherwise. An analog-to-digital converter and its application to image sensors.

20 Claims, 5 Drawing Sheets

ANALOG-TO-DIGITAL CONVERTER

BACKGROUND

1. Technical Field

The present disclosure generally relates to the conversion of analog signals into digital signals and, more specifically, to such a conversion applied to signals issued by image sensors.

2. Description of the Related Art

Analog-to-digital converters are used in image sensors to convert an analog signal representative of the light intensity sensed by a photodiode into a digital signal to be stored and processed in digital circuits. The accuracy of the information stored in digital form depends, not only on the accuracy of the analog circuits, but also on the number of bits into which this analog signal is converted. However, the larger the number of bits of the converter, the more space said converter takes up or the longer the conversion time or both.

Two types of noise are likely to influence the signal-to-noise ratio of the converter. For a low-level signal, a so-called read noise, linked to the acquisition chain and independent from the signal level, predominates. The level of this noise conditions the analog equivalent of the least significant bit. Noise linked to the signal adds thereto. This noise, called the shot noise, is proportional to the square root of the number of electrons received by the sensor.

In an image sensor, a converter is generally assigned to each pixel column of the sensor and conversions are performed simultaneously for the pixels of a same line. Accordingly, when the number of conversion bits is increased, the resulting size increase is to be multiplied by the number of columns and the processing time increase is to be multiplied by the number of lines.

On the analog signal side, once the read noise has become smaller than the shot noise, the signal-to-noise ratio is equal to $N/\sqrt{N}$, where N represents the number of electrons received by the sensor.

It has already been provided to take into account the shot noise in an image sensor by varying the slope of the ramp of a ramp converter. This amounts to settling, for high-level signals, for a coarser resolution than with a low-level signal. Actually, the ramp slope increases along time over a measurement period. Such a solution is described in the article "A Low-Power Column-Parallel 12-bit ADC for CMOS Imagers" by M. F. Snoeij et al. (Delft University of Technology) published in June 2005.

For a given bulk, a variable-ramp solution does not increase the number of bits provided by the converter, but it provides a benefit in time by decreasing the number of quantization levels. Further, the response time of the converter comparators depends on the ramp slope. The variable ramp is thus likely to generate a quantization error.

It would be desirable to be able to increase the resolution of an analog-to-digital converter without for all this increasing its complexity or its processing time.

As an example, it is more and more desired to pass from 10 to 12 bits for digital signals provided by image sensors.

BRIEF SUMMARY

The present disclosure aims at overcoming all or part of the disadvantages of known analog-to-digital converters for applications where the noise depends on the signal amplitude. One benefit of the present disclosure is to increase the number of bits of an analog-to-digital converter without excessively increasing its complexity or its processing time. Another benefit is a solution particularly well adapted to image sensors.

To achieve all or part of these advantages as well as others, the present disclosure provides a method of analog-to-digital conversion over n bits of an analog signal that includes comparing the amplitude of the analog signal with a threshold representing the amplitude of the full-scale analog signal divided by $2^k$, where k is an integer smaller than n; and performing an analog-to-digital conversion of the analog signal over n−k bits to obtain the n−k most significant bits of a binary word over n bits if the result of the comparison step indicates that the amplitude of the input signal is greater than the threshold, and the n−k least significant bits of this binary word otherwise.

According to another embodiment, the analog-to-digital conversion over n−k bits takes as a full-scale value a value equal to $Vref/2^{(k*(1-R))}$, the quantization level of the conversion over n−k then being $Vref/2^{(n-k*R)}$, where R represents a binary variable taking value 0 if the amplitude of the analog signal is smaller than or equal to the threshold and value 1 otherwise; and the binary word over n bits is formed by multiplying the result of said conversion over n−k bits by $2^{(k*R)}$.

According to a further embodiment, if the amplitude of the input signal is greater than the threshold, the k least significant bits of the word over n bits are obtained randomly.

In accordance with yet another embodiment, the present disclosure also provides an analog-to-digital converter over n bits of an analog signal that includes an element for comparing the amplitude of the analog signal with a threshold representing the amplitude of the full-scale analog signal divided by $2^k$, where k is an integer smaller than n; and an element of analog-to-digital conversion of the analog signal over n−k bits to obtain the n−k most significant bits of a binary word over n bits if the result of the comparison step indicates that the amplitude of the input signal is greater than the threshold, and the n−k least significant bits of this binary word over n bits otherwise.

According to a further embodiment, the converter further includes an element for storing a binary datum R provided by the comparison element and equal to 1 if the amplitude of the analog signal is greater than the threshold; and at least one first digital element capable of forming a binary word over n bits by multiplying the value obtained at the output of the element of conversion over n−k bits by $2^{k*R}$, the full scale of the analog-to-digital element of conversion over n−k bits being adjusted to value $Vref/2^{(k*R)}$.

According to yet another embodiment, the converter further includes a second digital element capable of adding, in the case where binary datum R is 1, a random number to the binary number over n bits provided by the first digital element, the output of the second digital element forming the converter output.

According to another aspect of the converter, the conversion element is a ramp converter using two different ramps with a ratio of $2^k$ between their slopes, the converter further including an element of connection of the comparison element to one of the two ramps according to the value of binary datum R.

According to a further aspect of the converter, the conversion element is by successive approximations, the comparison and conversion elements formed of a same comparator, and the converter further including an element for selecting the full-scale value according to the value of binary datum R.

According to yet a further aspect of the converter, the conversion element is of a pipeline type, the converter further including upstream of the conversion element, a stage having its gain selected according to the value of binary datum R.

The present disclosure also provides an image sensor that includes an array of pixels, each comprising at least one element for storing luminance data; at least one analog-to-digital converter; and at least one storage element.

The present disclosure also provides an electronic system that has at least one circuit capable of providing an analog signal to be converted into a digital signal; at least one analog-to-digital converter; and at least one circuit capable of exploiting the digital signal.

In accordance with still yet a further embodiment of the present disclosure, an analog-to-digital converted is provided for n bits of an analog signal, the convert including a threshold determining circuit that generates a threshold representing an amplitude (Vref) of the full scale analog signal divided by $2^k$ where k is an integer smaller than n; a comparator that compares the amplitude of the analog signal with the threshold; and a conversion circuit coupled to the comparator that generates a converted signal of the analog signal over the n–k bits and outputs the most significant bits of a binary word over n bits when the comparator outputs a comparison signal that indicates the analog signal input amplitude is greater than the threshold and otherwise outputs the least significant bits of the binary word.

BRIEF DESCRIPTION OF THE SEVERAL VIEWS OF THE DRAWINGS

The foregoing features and advantages of the present disclosure will be discussed in detail in the following non-limiting description of specific embodiments in connection with the accompanying drawings, wherein.

DETAILED DESCRIPTION

Figure 1:
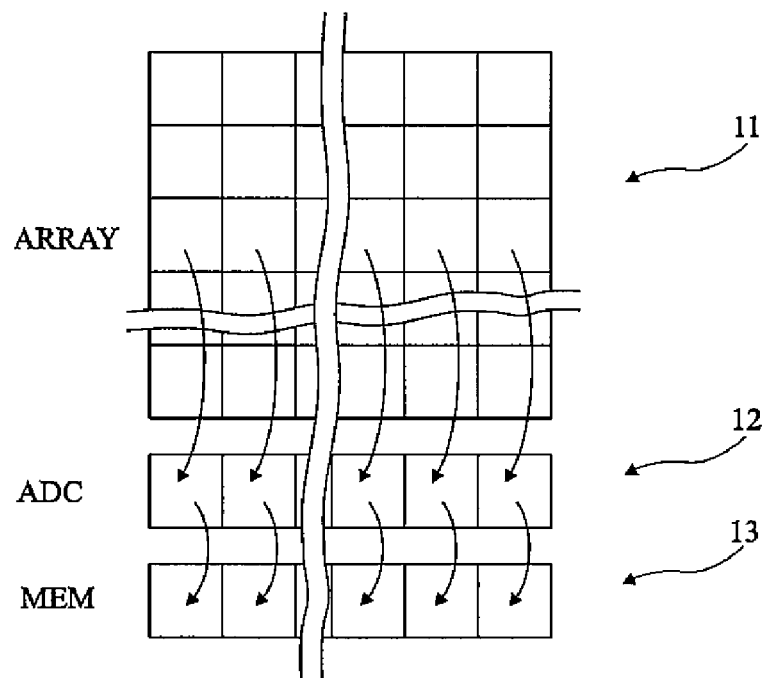
FIG. 1 is a simplified view of an image sensor of the type to which the present disclosure applies as an example.

For clarity, only those steps and elements which are useful to the understanding of the present disclosure have been shown and will be described. In particular, the mechanisms by which the analog signals are acquired, especially in an image sensor, have not been detailed, the present disclosure being compatible with any usual acquisition. Further, what use is made of the digital signals provided by the converter has not been detailed either, the present disclosure being here again compatible with any current use. The same elements have been designated with the same reference numerals in the different drawings.

The present disclosure will be more specifically described in relation with an example of application to image sensors. It however more generally applies to any analog-to-digital conversion in which similar problems are likely to arise and especially in which the noise level varies along with the amplitude of the useful signal. For example, the present disclosure also applies to power conversion systems, to systems for controlling the power emitted in a radio transmission chain or in a gain control, where envelope data are extracted from the signal with a useful part varying within a very wide range and where a disturbance varies along with the amplitude to be measured.

FIG. 1 is a simplified view in the form of blocks of an image sensor of the type to which the present disclosure applies as an example.

Such a sensor includes an array 11 of pixels, each pixel including at least one element for storing data relative to the luminance sensed by a photodiode (not shown). The array is exploited in one direction (for example, in columns), that is, the luminance data stored in the pixel or in any intermediary storage element are provided, for all the columns in a same line 12, to a line of analog-to-digital converters (ADC) having their respective results stored in storage elements 13 (MEM) for a subsequent use.

Figure 2:
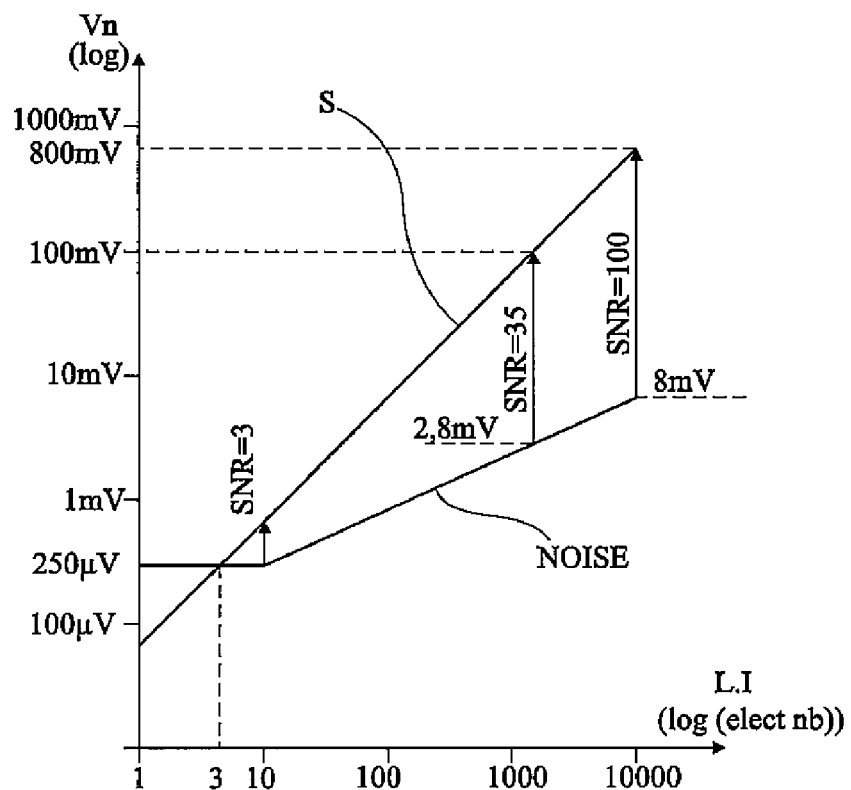
FIG. 2 shows a characteristic of an analog output voltage versus the lighting intensity in a pixel of an image sensor, as well as the noise level (shot and read noise) and the signal-to-noise ratio.

FIG. 2 shows the variation of voltage Vin of a pixel according to the light intensity LI sensed by the photodiode as well as the noise level (shot and read noise) and the signal-to-noise ratio. The representation of FIG. 2 is in logarithmic scale, the light intensity being expressed in number of electrons.

In an image sensor, the level of signal S according to the light intensity follows an approximately linear course, of constant slope in logarithmic scale. Further, the more the number of electrons collected by a pixel increases, the more the shot noise increases. As soon as the read noise has been passed, noise NOISE represents the shot noise which is proportional to $\sqrt{N}$, where N represents the number of electrons collected by the pixel photodiode. The preponderating contributor to noise NOISE is the shot noise. As a result, signal-to-noise ratio SNR also has a $\sqrt{N}$ variation. As illustrated in FIG. 2, the read noise dominates for low-level signals (low lighting of the sensor). To be able to properly exploit the results, the resolution of the analog-to-digital converter must be selected according to this read noise. In practice, a resolution that approximately corresponds to the read noise for low-level signals is selected.

However, for a high-level signal, the noise level becomes such that several of the bits provided by the converter are no longer significant.

The previously-mentioned article "A Low-Power Column-Parallel 12-bit ADC for CMOS Imagers" exploits the shot noise phenomenon to provide an analog-to-digital converter with a ramp which is variable along time. This document provides, in a single-slope converter architecture, a ramp having a step increasing along with the ramp voltage value in relation with the noise expected on the corresponding signal. This enables decreasing the conversion time with respect to a single-ramp converter.

Figure 3:
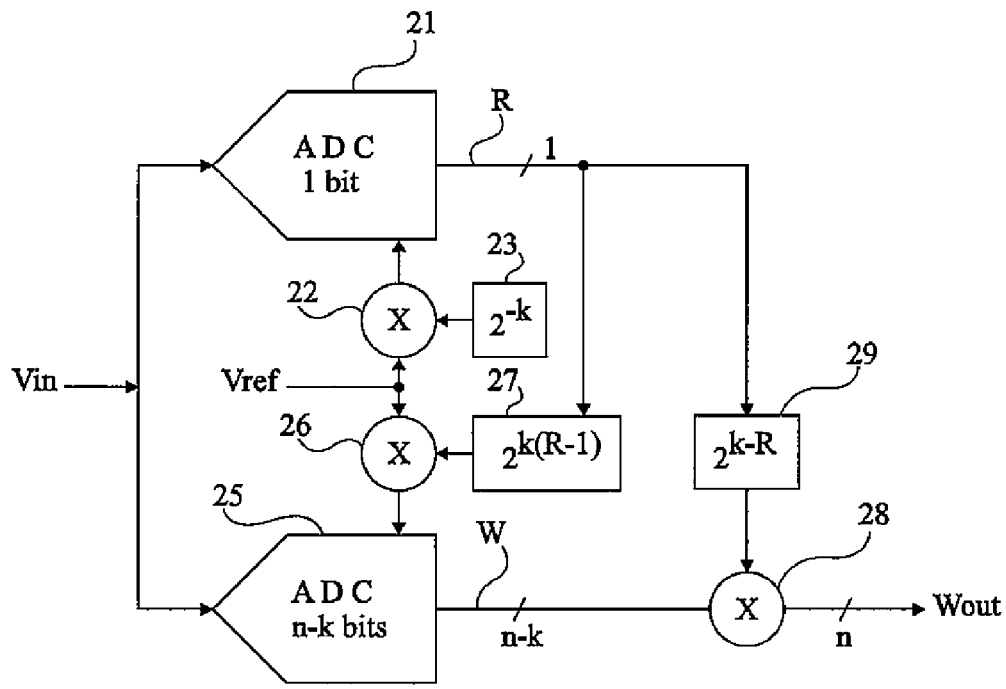
FIG. 3 illustrates an embodiment of an analog-to-digital converter formed in accordance with the present disclosure.

FIG. 3 is a functional block diagram of an embodiment of an analog-to-digital converter of an analog signal Vin (originating, for example, from an image sensor pixel) into a digital word Wout over n bits.

Figure 4:
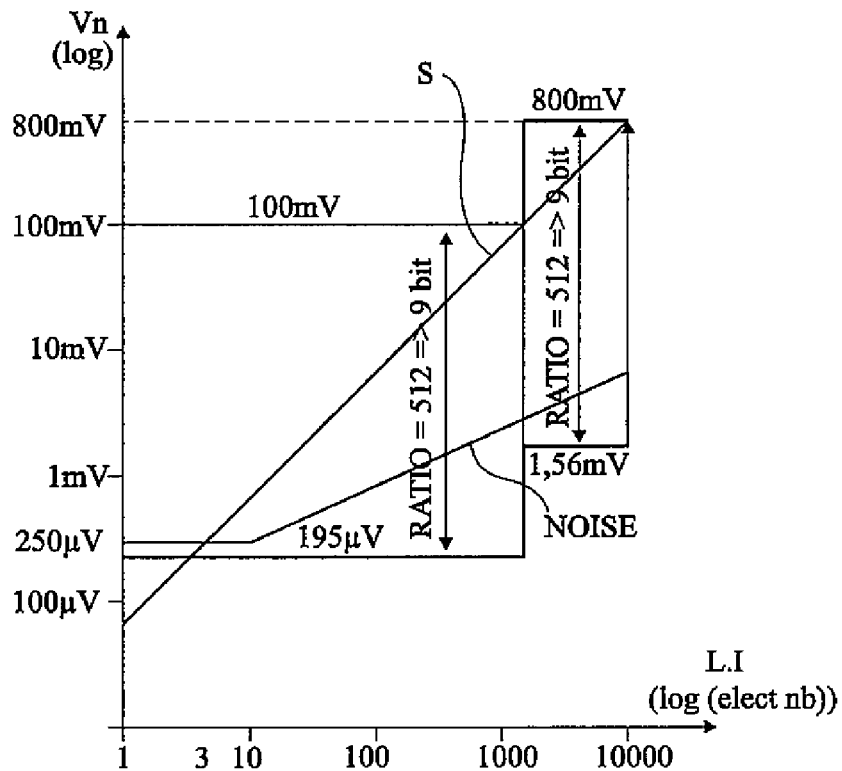
FIG. 4 illustrates a characteristic of the analog voltage provided by a pixel of an image sensor versus the lighting intensity in accordance with application of the present disclosure.

FIG. 4 is a graph illustrating the operation of the converter of FIG. 3. The graph of FIG. 4 should be compared with that of FIG. 2.

The performed conversion starts by determining an amplitude range where signal Vin to be digitized can be found. This determination is illustrated in FIG. 3 by a converter 21 (1 bit ADC) over a single bit of voltage Vin with respect to a voltage level Vref*$2^{-k}$ (with multiplier 22 and block 23 providing a value $2^{-k}$). This amounts to comparing the amplitude of signal Vin to a threshold Vref/$2^{-k}$. Converter 21 provides a bit R indicative of the range of the input signal. Number N−k (n and k being integers) represents the number of bits over which the useful range of the signal is converted. In the example of FIG. 4, a number n−k of 9 bits is assumed to obtain a converter over n=12 bits.

Once the range has been determined, bit R is used to determine reference voltage Vref*$2^{k(R-1)}$ of a second converter 25 (n–k-bit ADC) of input signal Vin (with multiplier 26 and block 27 calculating value k(R−1)). Converter 25 provides a word W over n−k bits which represents the conversion of the useful part of the signal. Finally, word W is multiplied by $2^{k*R}$ (multiplier 28 and block 29) or submitted to any equivalent operation to provide a word Wout over n bits. Multiplication 28 amounts to selecting whether the n−k bits of word W are on the least significant bit side (LSB) or on the most significant bit side (MSB) of result Wout over n bits. Thus, as a variation, other processings than a multiplication may be provided to obtain the n−k most significant bits of a binary word over n bits if the result of the comparison step indicates that the amplitude of the input signal is greater than the threshold, and the n−k least significant bits of this binary word otherwise. Minimum reference level Vref/$2^n$ is selected to approximately correspond to the low-level signal noise level of signal Vin to be digitized, level Vref corresponding to the full scale of the signal. It can be considered that a converter of low resolution (over one bit in this example) is used to determine the amplitude range containing the useful signal, and a converter of high resolution is used to convert this useful signal. The quantization level of the global converter over n bits (smallest detectable analog voltage level—analog value of the increment by one bit) remains equal, whatever the range, to Vref/$2^n$. The quantization level of the conversion of the useful signal over n−k bits depends on the range where the signal is located.

The resolution of the converter does not vary (n bits for the global converter—n−k bits for the "effective" converter). The full scale of the conversion depends on the prior comparison and is Vref/$2^{(k*R)}$.

As compared with a variable ramp comparator, a difference is that no conversion is performed with the converter over the entire range (n bits). Thus, not only does this provide a time gain, but also does it simplify the converter architecture and thus the surface area that it takes up.

Figure 5:
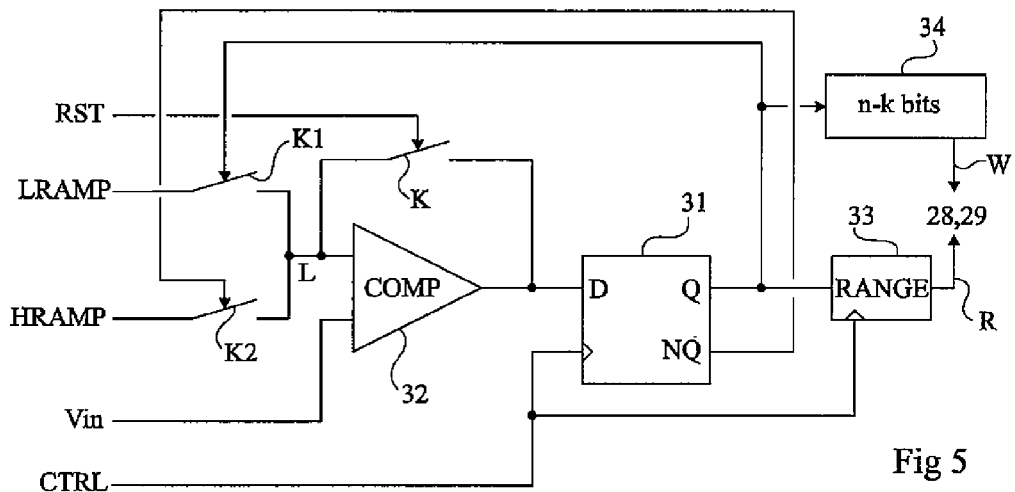
FIG. 5 shows in the form of blocks an embodiment of an analog-to-digital converter architecture formed in accordance with the present disclosure.

FIG. 5 is a simplified representation of an embodiment of a so-called ramp analog-to-digital converter. This example is based on the use of a memory point (for example, a D-type flip-flop 31) having its data input receiving the result provided by a comparator 32 (COMP) of input voltage Vin with respect to a level L. Level L is, for the digitization over n−k bits, provided by a linear ramp generator (not shown) providing a ramp of relatively strong slope HRAMP or of relatively small slope LRAMP according to the range (block 33, RANGE) in which signal Vin is located. In the shown embodiment, comparator 32 is used both for the signal conversion over the n−k bits and for the selection of the amplitude range of the useful signal. Comparator 32 is likely to be reset by a switch K, controlled by a signal RST and which connects its input receiving comparison level L to its direct output Q. Direct output Q of flip-flop 31 controls a first switch K1 of selection of ramp LRAMP while inverse output NQ controls a switch K2 of selection of ramp HRAMP. The clock input of flip-flop 31 receives a control signal CTRL comprising one pulse for each conversion. This pulse is provided after comparator 32 has performed the comparison.

The generation of ramps LRAMP and HRAMP may use any current generation system. For example, a generator providing two ramps, based on a counter associated with a digital-to-analog converter having its reference voltage, selected from among two values according to the range, sets the ramp slope.

In practice, to perform the conversion over n−k bits, the ramp converter provides n−k+1 bits (to take into account possible level offsets). The processing of these n−k+1 bits to obtain the n−k bits is usual.

Of course, the architecture of FIG. 5 is completed with elements for synchronizing the periods when signal Vin is output for conversion with respect to the periods when the ramps are provided.

Figure 6A:
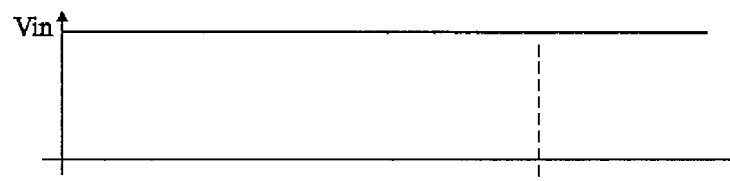
FIGS. 6A to 6F illustrate the operation of the architecture of FIG. 5.
Figure 6B:
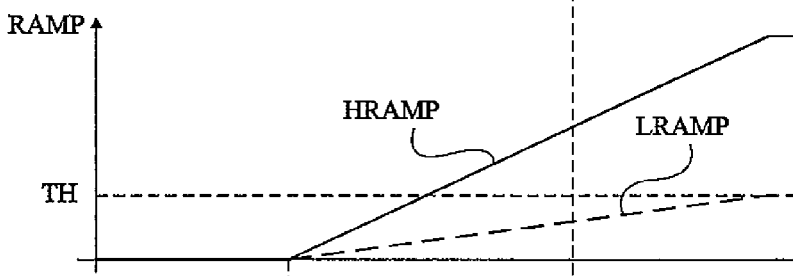
Figure 6C:
Figure 6D:
Figure 6E:
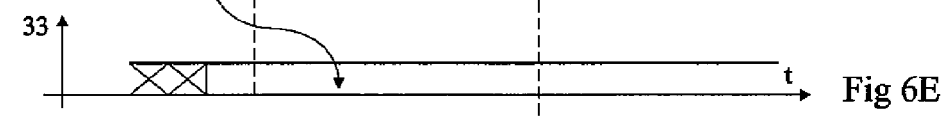
Figure 6F:
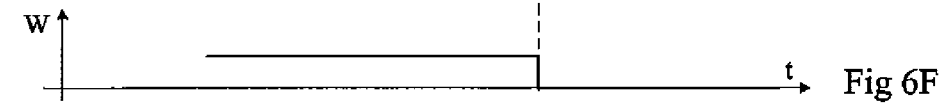

FIGS. 6A, 6B, 6C, 6D, 6E, and 6F are timing diagrams illustrating the operation of the converter of FIG. 5. FIG. 6A illustrates an example of the level of the analog signal Vin to be digitized. FIG. 6B illustrates the two ramps HRAMP and LRAMP according to a threshold TH between the two converter ranges. For simplification, these ramps have been shown as linear but they are most often stepped with a time step depending on the counting frequency associated with the digital-to-analog converter for generating the ramp. FIG. 6C illustrates clock or counting signal Ck of a digital-to-analog converter for generating the ramp. FIG. 6D illustrates the output signal provided by comparator 32. FIG. 6E shows the status contained in storage element 33. FIG. 6F illustrates word W resulting from the conversion, provided by flip-flop 31 and stored in a storage element 34 (n−k bits). The final result is obtained as indicated in FIG. 3 by multiplying word W by $2^{k*R}$, where R represents the state of register 33. A first comparison is performed with respect to threshold TH to determine the range in which input signal Vin is located. Threshold TH corresponds to the amplitude of ramp LRAMP, selected to correspond to Vref/$2^k$.

Once result R is known at the output of comparator 32, the ramp selection is performed by means of switch K1 or K2 and input signal Vin can be digitized in the corresponding range.

An advantage of the embodiment of FIG. 5 is that it enables to use a same comparator to both detect the signal range and perform the actual conversion.

Figure 7:
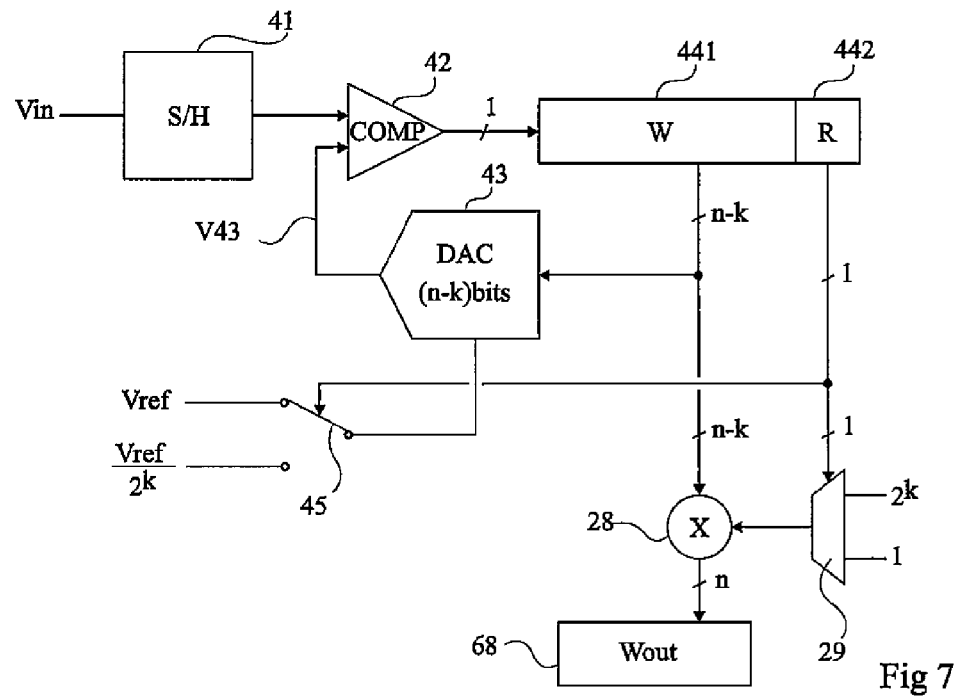
FIG. 7 is a block diagram of an embodiment of a successive-approximation analog-to-digital converter formed in accordance with the present disclosure.

FIG. 7 is a block diagram of an embodiment of a so-called successive-approximation analog-to-digital converter. Signal Vin is first sampled (block 41, S/H). Then, it is compared (comparator 42) with a signal V43 provided by a digital-to-analog converter over n−k bits which receives, as an input, the state stored in a storage element 44 resulting from the comparison of the previous approximation. Up to this, this corresponds to a usual successive-approximation converter.

According to the shown embodiment, storage element 441 is over n−k bits and is associated with an element 442 of storage of an additional bit R indicative of the range containing the input signal. Flag bit R is used to condition the reference of converter 43 between a reference level Vref corresponding to the maximum signal to be converted (full scale) and a level Vref/$2^k$ corresponding to a threshold TH between the two ranges. This enables converter 43 to generate a signal V43 according to the signal range detected over n−k bits (desired resolution range). A switch 45 controlled by the state of bit R selects the reference signal (full-scale value) of converter 43.

Once the range has been obtained by comparing signal Vin to threshold TH (Vref/$2^k$), signal Vin is digitized in its corresponding range. Then, word W contained in register 44 is multiplied (multiplier 28) either by $2^k$, or by 1 (multiplexer 29) according to the status of bit R, to provide, for example to a register 68, result Wout over n bits.

An analog-to-digital converter of apparent resolution n bits is obtained from an n–k-bit converter. To achieve this:

signal Vin to be processed is compared with a level Vref/$2^k$ to determine status 0 (if the amplitude of signal Vin is smaller than or equal to level Vref/$2^k$) or 1 (if the amplitude of signal Vin is greater than level Vref/$2^k$) of a variable R;

signal Vin to be processed is converted by successive approximations over n–k bits by taking, as a full-scale value, value Vref/$2^{k*(n-k*R)}$ (conversion quantization level of Vref/$2^{k*(1-R)}$); and the n-bit word is formed by digital processing.

Figure 8:
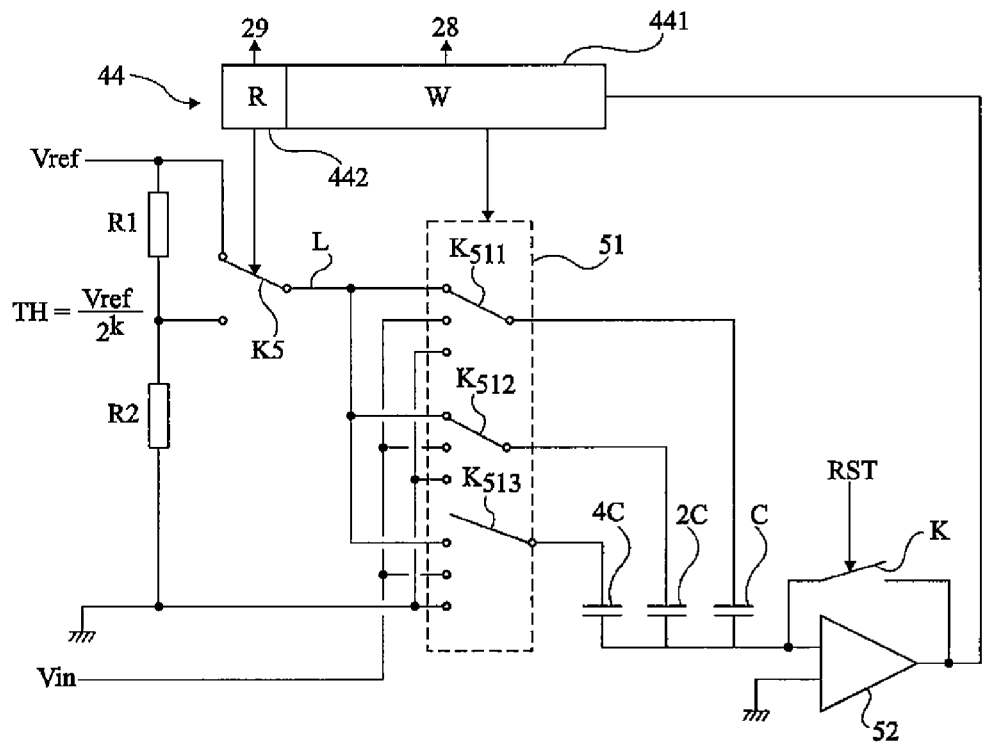
FIG. 8 is a more detailed block diagram of an embodiment of a successive-approximation converter such as that in FIG. 7.

FIG. 8 shows a more detailed embodiment of a successive-approximation analog-to-digital converter of the type in FIG. 7. The example of FIG. 8 corresponds to a 6-bit converter using a switched-capacitance architecture.

Such a converter is based on the use of three capacitive elements of respective capacitances C, 2C, and 4C, and of an array 51 of switches K511, K512, and K513 for selecting the capacitors used for each approximation according to the previous approximations. The switched capacitors are used to implement the sampling function (41, FIG. 7) and a portion of the analog-to-digital converter (43, FIG. 7).

A first common electrode of the capacitors is connected to a first input of a comparator 52, having a second input connected to ground and having its output providing a bit in a storage element 44 of the type illustrated in FIG. 7. It, for example, is a register intended to contain a word W over six bits and a bit R indicative of the range of the input signal. Comparator 52 is likely to be reset by means of a switch K connecting its first input to its output and which is controlled by a signal RST (this switch is used to cancel the comparator voltage error and may be grounded if the comparator is sufficiently accurate or if another way is used to cancel this error). First common inputs of switches K511 to K513 receive a level L provided by a selector K5 between full-scale level Vref of the converter and an intermediary level TH (equal to Vref/$2^k$) sampled at the midpoint of a resistive dividing bridge comprising two resistors R1 and R2 in series between the terminal of application of level Vref and the ground. Second common respective inputs of switches K511 to K513 are grounded. Third common inputs of switches K511 to K513 are connected to a terminal of application of signal Vin to be digitized. The assembly is synchronized according to a sampling frequency corresponding to the rate of the successive approximations.

The operation of the converter of FIG. 8 is the following. Analog signal Vin is applied to the corresponding inputs of switches K511 to K513.

In the sampling, switch K for resetting comparator 52 is on to store signal Vin in respective capacitors C, 2C, and 4C. Then, switch K is turned off and switch K5 takes reference TH while switches K511 and K513 are switched to this reference. The charge balance between the different capacitors enables to compare the signal level with level Vref/$2^k$. This result is stored in bit R defining the corresponding range of signal Vin. Switch K5 is then switched to one of its two positions until the end of the conversion to define the comparison range of the signal by selecting level Vref or level TH. Then, capacitors C, 2C, and 4C and switches K511 to K513 are used, currently, as in a charge redistribution converter (switched-capacitor successive-approximation converter).

At the end of the comparison, respective results R and W are exploited to form word Wout (not shown).

The steps of application of level TH to capacitors C, 2C, and 4C to compare level Vin therein, and of selection of the comparison range, replace the steps of determination of the most significant bits of a usual switched capacitor converter.

Taking the example of a level TH equal to ⅛ of level Vref (k=3), the switched-capacitor converter of FIG. 8 enables, as compared with a usual switched-capacitor converter, to increase the resolution by 3 bits at the cost of a small surface area increase. In a usual switched-capacitor converter, adding 1 resolution bit requires multiplying the surface by approximately 8 (the number of resistors and capacitors used for the voltage subdivision is multiplied by 2, which results in an approximately four times larger surface area, and each subdivision must be on the order of twice as accurate, which results in an approximately double surface area for component matching reasons). Increasing the resolution by three bits requires a surface area factor of more than 500 ($8^3$).

Figure 9:
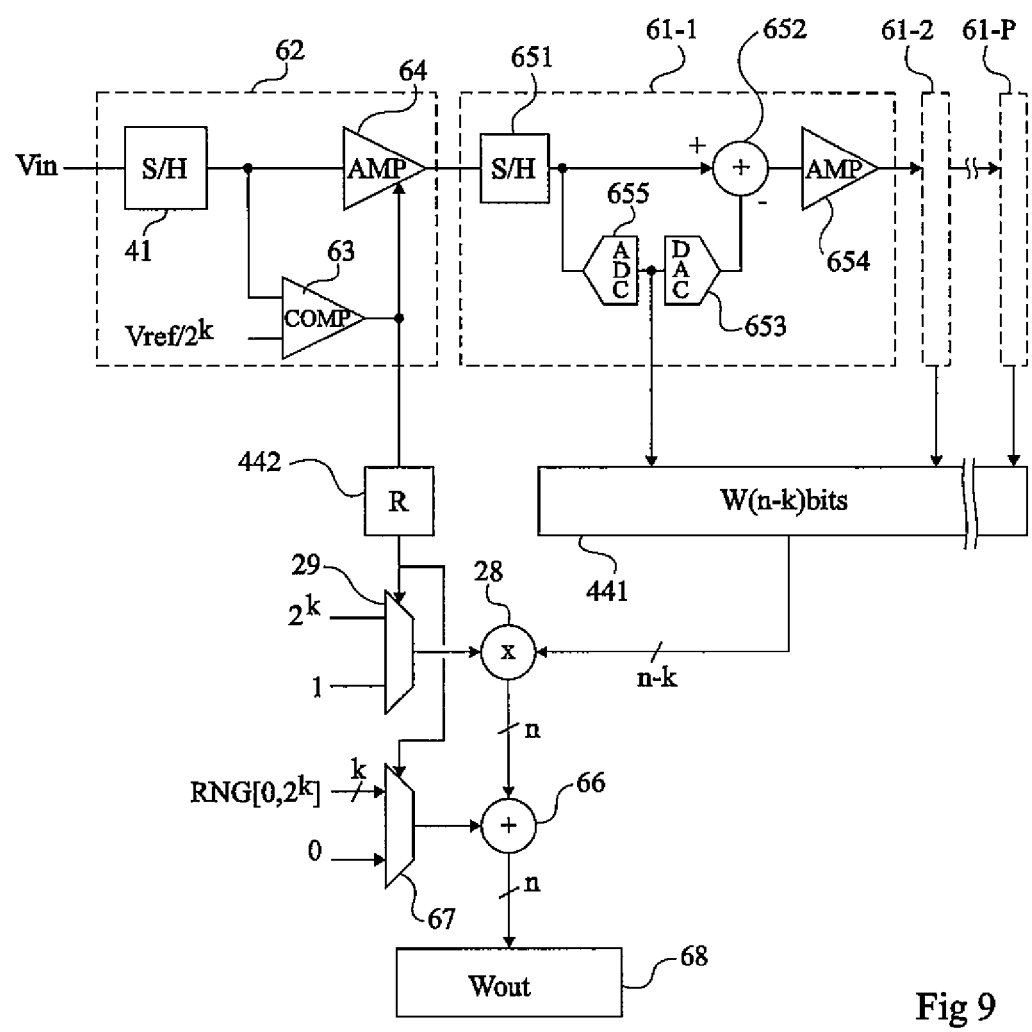
FIG. 9 shows an embodiment of a pipeline-type analog-to-digital converter formed in accordance with the present disclosure.

FIG. 9 shows an embodiment of an analog-to-digital converter respecting a so-called pipeline architecture. Such an architecture uses several stages 61-1, 61-2, 61-p over a same number of bits and uses the principle of each time replacing the signal in full amplitude for the next stage.

The contribution of this first embodiment to a usual pipeline converter is to add a first stage 62 of determination of the range of the signal to be converted. Analog level Vin is sent onto a sampling circuit 41 having its output compared (comparator 63) with level Vref/$2^k$ corresponding to the threshold between the two ranges. The output of comparator 63 conditions the gain of an amplifier 64 to enter the next stage 61-1. Further, this output is stored (block 442) to store bit R. Successive stages 61-1 to 61-p are all similar and each comprise a unit 651 (S/H) for sampling and holding the signal provided by the previous stage (output of its amplifier). The output of sample-and-hold unit 651 is sent onto an adder/subtractor 652 having its other input receiving the result of a digital-to-analog conversion 653 (DAC) of the result of an analog-to-digital conversion 655 (ADC) of the output of sample-and-hold unit 651. The output of converter 655 is also sent to register 441 of storage of word W over n–k bits. The output of adder/subtractor 652 is sent to the input of an amplifier 654 (AMP) having its output sent to the input of the next stage. Assuming a converter having each stage over one bit, the converter comprises as many stages as word W comprises bits, that is, n–k, and each stage provides one or several bits to register 44 according to the number of bits per stage. Other pipeline converter versions may be used by using several bits per stage in a usual manner. At the end of the conversion, the bit contained in register 442 is used by multiplier 28. FIG. 9 illustrates a variation in which, if bit R is 1, a randomly-selected number ranging between 0 and $2^k$ is added (or subtracted) to the result of multiplier 28. This avoids for the k least significant bits to be at 0 for signals of high amplitude. This functionality is illustrated by an adder 66 receiving the output of multiplier 28 and the output of selector 67 between a random value RNG[0, $2^k$] (or RNG[$-2^k$, $2^k$]) and value 0. The selector is controlled by bit R and the output of adder 66 provides word Wout stored in register 68. This variation may be applied to all the described embodiments.

The different synchronization signals of the elements shown in FIGS. 3, 5, 7, 8, and 9 have not been detailed. This synchronization is within the abilities of those skilled in the art based on the indicated functional indications.

An advantage of the described embodiments is that they enable to use an analog-to-digital converter over a small number of bits with respect to the finally-obtained number of bits.

This results in a surface area and time benefit for the conversion.

Various embodiments have been described, different variations and modifications will occur to those skilled in the art. In particular, although three examples of analog-to-digital converters have been described, the present disclosure more specifically applies whatever the converter architecture, provided for this architecture to be compatible with the execution of a previous comparison to determine the range of the useful signal.

Further, the selection of number k of bits determining the converter range is within the abilities of those skilled in the art according to the application and especially to the noise variation in the signal to be converted.

Moreover, although reference has been made in the foregoing description to a comparison with a result providing a flag bit R at state 1 for the higher range, the result of the comparison may be inverted, provided to adapt the subsequent processings so that the final binary word is formed, for example, by multiplication of the conversion over n−k bits by $2^k$ when the analog signal to be converted is greater than threshold TH.

Finally, the practical implementation is within the abilities of those skilled in the art based on the functional indications given hereabove.

Such alterations, modifications, and improvements are intended to be part of this disclosure and are intended to be within the spirit and the scope of the present disclosure. Accordingly, the foregoing description is by way of example only and is not intended to be limiting. The present disclosure is limited only as defined in the following claims and the equivalents thereto.

Moreover, the various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method of analog-to-digital conversion over n bits of an analog signal, comprising the steps of:
   comparing an amplitude of the analog signal with a threshold representing the amplitude (Vref) of the full-scale analog signal divided by $2^k$, where k is an integer smaller than n;
   performing an analog-to-digital conversion of the analog signal over n−k bits to obtain the n−k most significant bits of a binary word over n bits if the result of the comparison step indicates that the amplitude of the input signal is greater than the threshold, and to otherwise obtain the n−k least significant bits of this binary word.

2. The method of claim 1, wherein the analog-to-digital conversion over n−k bits takes as a full-scale value a value equal to $Vref/2^{(k*(1-R))}$, the quantization level of the conversion over n−k then being $Vref/2^{(n-k*R)}$, where R represents a binary variable taking value 0 if the amplitude of the analog signal is smaller than or equal to the threshold and value 1 otherwise; and
   the binary word over n bits is formed by multiplying the result of said conversion over n−k bits by $2^{(k*R)}$.

3. The method of claim 1, wherein, if the amplitude of the input signal is greater than the threshold, the k least significant bits of the word over n bits are obtained randomly.

4. An analog-to-digital converter over n bits of an analog signal, comprising:
   a circuit structured to compare an amplitude of the analog signal with a threshold representing the amplitude (Vref) of the full-scale analog signal divided by $2^k$, where k is an integer smaller than n; and
   a circuit structured to perform an analog-to-digital conversion of the analog signal over n−k bits to obtain the n−k most significant bits of a binary word over n bits if the result of the comparison indicates that the amplitude of the input signal is greater than the threshold, and the n−k least significant bits of this binary word over n bits otherwise.

5. The converter of claim 4, further comprising:
   a circuit structured to store a binary datum R provided by the comparison circuit and equal to 1 if the amplitude of the analog signal is greater than the threshold; and
   at least one first digital circuit capable of forming a binary word over n bits by multiplying the value obtained at the output of the conversion circuit over n−k bits by $2^{k*R}$, the full scale of the analog-to-digital conversion circuit over n−k bits being adjusted to value $Vref/2^{(k*R)}$.

6. The converter of claim 5, further comprising a second digital circuit structured to add, in the case where the binary datum R is 1, a random number to the binary number over n bits provided by the first digital circuit, the output of the second digital circuit forming the converter output.

7. The converter of claim 5, wherein the conversion circuit is a ramp converter using two different ramps with a ratio of $2^k$ between their slopes, the converter further comprising an element of connection of said comparison circuit to one of the two ramps according to the value of binary datum R.

8. The converter of claim 5, wherein the conversion circuit is structured to use successive approximations, said comparison and conversion circuits formed of a same comparator, and the converter further comprising a circuit for selecting the full-scale value according to the value of binary datum R.

9. The converter of claim 5, wherein the conversion circuit is of a pipeline type, the converter further comprising, upstream of the conversion circuit, a stage having a gain selected according to the value of binary datum R.

10. An image sensor that utilizes an analog signal, comprising:
    an array of pixels each including at least one element for storing luminance data;
    at least one analog-to-digital converter having a comparison circuit structured to compare an amplitude of the analog signal with a threshold representing the amplitude (Vref) of the full-scale analog signal divided by $2^k$, where k is an integer smaller than n;
    a circuit structured to perform an analog-to-digital conversion of the analog signal over n−k bits to obtain the n−k most significant bits of a binary word over n bits if the result of the comparison indicates that the amplitude of the input signal is greater than the threshold, and the n−k least significant bits of this binary word over n bits otherwise; and at least one storage element.

11. The sensor of claim 10, wherein the analog-to-digital converter comprises:

a circuit structured to store a binary datum R provided by the comparison circuit and equal to 1 if the amplitude of the analog signal is greater than the threshold; and at least one first digital circuit structured to form a binary word over n bits by multiplying the value obtained at the output of the conversion circuit over n−k bits by $2^{k*R}$, the full scale of the analog-to-digital conversion circuit over n−k bits being adjusted to value $Vref/2^{(k*R)}$.

12. The sensor of claim 11, further comprising a second digital circuit structured to add, in the case where the binary datum R is 1, a random number to the binary number over n bits provided by the first digital circuit, the output of the second digital circuit forming the converter output.

13. An electronic system comprising:

at least one circuit structured to provide an analog signal to be converted into a digital signal;

at least one analog-to-digital converter comprising a comparison circuit structured to compare an amplitude of the analog signal with a threshold representing the amplitude (Vref) of the full-scale analog signal divided by $2^k$, where k is an integer smaller than n;

a circuit structured to perform an analog-to-digital conversion of the analog signal over n−k bits to obtain the n−k most significant bits of a binary word over n bits if the result of the comparison indicates that the amplitude of the input signal is greater than the threshold, and the n−k least significant bits of this binary word over n bits otherwise; and at least one circuit adapted to receive the digital signal.

14. The electronic system of claim 13, wherein the analog-to-digital converter comprises:

a circuit structured to store a binary datum R provided by the comparison circuit and equal to 1 if the amplitude of the analog signal is greater than the threshold; and at least one first digital circuit structured to form a binary word over n bits by multiplying the value obtained at the output of the conversion circuit over n−k bits by $2^{k*R}$, the full scale of the analog-to-digital conversion circuit over n−k bits being adjusted to value $Vref/2^{(k*R)}$.

15. The electronic system of claim 14, further comprising a second digital circuit structured to add, in the case where the binary datum R is 1, a random number to the binary number over n bits provided by the first digital circuit, the output of the second digital circuit forming the converter output.

16. An analog-to-digital converter for n bits of an analog signal, the converter comprising:

a threshold determining circuit structured to generate a threshold representing an amplitude (Vref) of the full scale analog signal divided by $2^k$ where k is an integer smaller than n;

a comparator structured to compare an amplitude of the analog signal with the threshold; and a conversion circuit coupled to the comparator and structured to generate a converted signal of the analog signal over the n−k bits and outputs the most significant bits of a binary word over n bits when the comparator outputs a comparison signal that indicates the analog signal input amplitude is greater than the threshold and otherwise outputs the least significant bits of the binary word.

17. The converter of claim 16, further comprising:

a circuit structured to store a binary datum R provided by the comparator and equal to 1 if the amplitude of the analog signal is greater than the threshold; and at least one first digital circuit structured to form a binary word over n bits by multiplying the value obtained at the output of the conversion circuit over n−k bits by $2^{k*R}$, the full scale of the analog-to-digital conversion circuit over n−k bits being adjusted to value $Vref/2^{(k*R)}$.

18. The converter of claim 17, wherein the conversion circuit comprises a ramp converter using two different ramps with a ratio of $2^k$ between their slopes, the converter further comprising an element of connection of said comparison circuit to one of the two ramps according to the value of binary datum R.

19. The converter of claim 17, wherein the conversion circuit generates successive approximations, said comparison and conversion circuits formed of a same comparator, and the converter further comprising a circuit for selecting the full-scale value according to the value of binary datum R.

20. The converter of claim 17, wherein the conversion circuit is of a pipeline type, the converter further comprising, upstream of the conversion circuit, a stage having a gain selected according to the value of binary datum R.

* * * * *